US010759454B2

(12) United States Patent
Rodney

(10) Patent No.: US 10,759,454 B2
(45) Date of Patent: Sep. 1, 2020

(54) TRAINLINE PERFORMANCE EVALUATION

(71) Applicant: Diagnosys Inc., Westford, MA (US)

(72) Inventor: Matthew Patrick Rodney, Westford, MA (US)

(73) Assignee: Diagnosys Inc., Westford, MA (US)

( * ) Notice: Subject to any disclaimer, the term of this patent is extended or adjusted under 35 U.S.C. 154(b) by 0 days.

(21) Appl. No.: 16/580,690

(22) Filed: Sep. 24, 2019

(65) Prior Publication Data

US 2020/0094860 A1    Mar. 26, 2020

Related U.S. Application Data

(60) Provisional application No. 62/735,516, filed on Sep. 24, 2018.

(51) Int. Cl.
*B61L 15/00* (2006.01)
*G01R 31/00* (2006.01)
(Continued)

(52) U.S. Cl.
CPC ........ *B61L 15/0027* (2013.01); *B60T 13/665* (2013.01); *B61G 5/10* (2013.01);
(Continued)

(58) Field of Classification Search
CPC .... G01R 31/00; G01R 31/005; G01R 31/008; B61L 15/00; B61L 15/0018; B61L 15/0027; B61L 15/0036; B61L 15/0054; B61L 15/0072; B61L 15/0081; B61L 15/009; B61L 27/00; B61L 27/0055; B61G 5/00; B61G 5/06; B61G 5/10; B60T 13/00; B60T 13/10; B60T 13/66; B60T 13/665
(Continued)

(56) References Cited

U.S. PATENT DOCUMENTS 4,912,471 A *  3/1990  Tyburski ............... B61L 25/045
                                                340/10.34
5,404,465 A    4/1995  Novakovich et al.
(Continued)

FOREIGN PATENT DOCUMENTS

WO    2002023503 A1    3/2002

OTHER PUBLICATIONS

International Search Report and Written Opinion for International Application No. PCT/US2019/052633 entitled, "Trainline Performance Evaluation" dated Mar. 12, 2020.

*Primary Examiner* — Hoai-An D. Nguyen
(74) *Attorney, Agent, or Firm* — Hamilton, Brook, Smith & Reynolds, P.C.

(57) ABSTRACT

A system for testing trainline communications includes a command test box, a remote test box, and a controller. The command test box is coupled to a first electric coupler at a first end of a consist including one or more cars of a railroad train. The command test box applies a test signal to the first electric coupler and wirelessly transmits an indication of the test signal. The remote test box is coupled to a second electric coupler at a second end of the consist, and determines whether the test signal is present at the second electric coupler and wirelessly transmits an indication of the test signal. The controller communicates wirelessly with the test boxes to determine whether the test signal has successfully traversed the consist.

15 Claims, 10 Drawing Sheets

(51) Int. Cl.
*B60T 13/66* (2006.01)
*B61G 5/10* (2006.01)

(52) U.S. Cl.
CPC ......... *B61L 15/009* (2013.01); *B61L 15/0054* (2013.01); *B61L 15/0072* (2013.01); *B61L 15/0081* (2013.01); *G01R 31/008* (2013.01)

(58) Field of Classification Search
USPC ....... 324/600, 629, 637, 638, 642, 646, 500, 324/512, 527, 532–535; 702/127, 155, 702/158, 159
See application file for complete search history.

(56) References Cited

U.S. PATENT DOCUMENTS

| | | | |
|---|---|---|---|
| 7,012,436 B1* | 3/2006 | Pannell | G01R 31/083 324/533 |
| 10,399,551 B2* | 9/2019 | Naylor | B61L 15/0054 |
| 2003/0038711 A1* | 2/2003 | Lumbis | B61L 15/0054 303/7 |
| 2008/0053331 A1* | 3/2008 | Marra | B60T 17/228 105/26.05 |
| 2008/0304627 A1* | 12/2008 | Kim | H04M 1/24 379/27.03 |
| 2009/0217747 A1 | 9/2009 | Gallagher et al. | |
| 2010/0085058 A1 | 4/2010 | Gallagher et al. | |
| 2013/0018534 A1* | 1/2013 | Hilleary | B61L 29/30 701/19 |
| 2013/0018560 A1* | 1/2013 | Smith | B60T 13/665 701/70 |
| 2015/0232110 A1* | 8/2015 | Ghaly | B61L 27/0038 246/62 |
| 2015/0276555 A1* | 10/2015 | Bourgoin | G01M 17/007 702/122 |
| 2019/0351923 A1* | 11/2019 | Koshino | B61L 23/00 |
| 2020/0001857 A1* | 1/2020 | Naylor | B60T 13/665 |

\* cited by examiner

TRAINLINE PERFORMANCE EVALUATION

RELATED APPLICATION

This application claims the benefit of U.S. Provisional Application No. 62/735,516, filed on Sep. 24, 2018. The entire teachings of the above application are incorporated herein by reference.

BACKGROUND

Several railroad cars can be coupled together to form a consist. When coupling the railroad cars, various power and communications and power lines of each railroad car are connected to adjacent railroad cars to form continuous communications and power lines that extend through the entire consist. An electric coupler at each end of the railroad cars joins the communications and power lines to a common interface that can be coupled to a matching interface of an adjacent railroad car.

SUMMARY

Example embodiments include a system for testing trainline communications, comprising a command test box, a remote test box, and a controller. The command test box may be configured to couple to a first electric coupler at a first end of a consist including at least one car of a railroad train. The command test box may be configured to 1) apply a test signal to the first electric coupler and 2) wirelessly transmit an indication of the test signal. The remote test box may be configured to couple to a second electric coupler at a second end of the consist, and may be configured to 1) determine a receive status indicating whether the test signal is present at the second electric coupler and 2) wirelessly transmit an indication of the test signal. The controller may be configured to 1) receive wirelessly the indication of the test signal, 2) compare the indication of the test signal against the receive status, and 3) determine, based on the comparison, whether the test signal has traversed the consist.

The controller may include a user interface, the controller being configured to display, at the user interface, a diagnosis of the consist based on the comparison. The diagnosis may include 1) a representation of at least one of the first and second electric couplers and 2) an indication of whether the test signal has traversed at least a subset of pins of the at least one of the first and second electric couplers.

The controller and the remote test box may be enclosed within a common enclosure. Alternatively, the command test box and the controller may be enclosed within a common enclosure. In such an embodiment, the command test box may transmit the indication of the test signal via a wired channel, and the remote test box may wirelessly transmit the receive status to the controller.

The command test box may be configured to apply the test signal, sequentially or concurrently, to a plurality of pins of the first electric coupler. The controller may be further configured to determine, based on the comparison, whether the test signal has traversed the consist via channels corresponding to the plurality of pins. Embodiments may further include a self test box, the self test box including a pair of interconnected interfaces configured to couple with the command test box and the remote test box.

A further example embodiment includes a system for testing trainline communications, comprising a command test box, a remote test box, and a controller. The command test box may be configured to couple to a first electric coupler at a first end of a consist including at least one car of a railroad train. The command test box may be configured to 1) apply a test signal to the first electric coupler and 2) transmit an indication of the test signal. The remote test box may be configured to couple to a second electric coupler at a second end of the consist, and may be configured to determine a receive status indicating whether the test signal is present at the second electric coupler. The controller may be configured to 1) receive the indication of the test signal, 2) compare the indication of the test signal against the receive status, and 3) determine, based on the comparison, whether the test signal has traversed the consist.

The command test box may be further configured to transmit wirelessly to the controller the indication of the test signal. In such a configuration, the controller and the remote test box may be enclosed within a common enclosure. Further, the remote test box may be further configured to transmit wirelessly the indication of the receive status. In such a configuration, the controller and the command test box may be enclosed within a common enclosure.

The remote test box may be further configured to transmit the indication of the receive status via a channel connected to the first and second electric couplers. In such a configuration, the controller and the command test box may be enclosed within a common enclosure, and the controller may to receive the indication of the receive status at the first electric coupler.

BRIEF DESCRIPTION OF THE DRAWINGS

The foregoing will be apparent from the following more particular description of example embodiments of the invention, as illustrated in the accompanying drawings in which like reference characters refer to the same parts throughout the different views. The drawings are not necessarily to scale, emphasis instead being placed upon illustrating embodiments of the present invention.

DETAILED DESCRIPTION

A description of example embodiments follows.

Figure 1A:
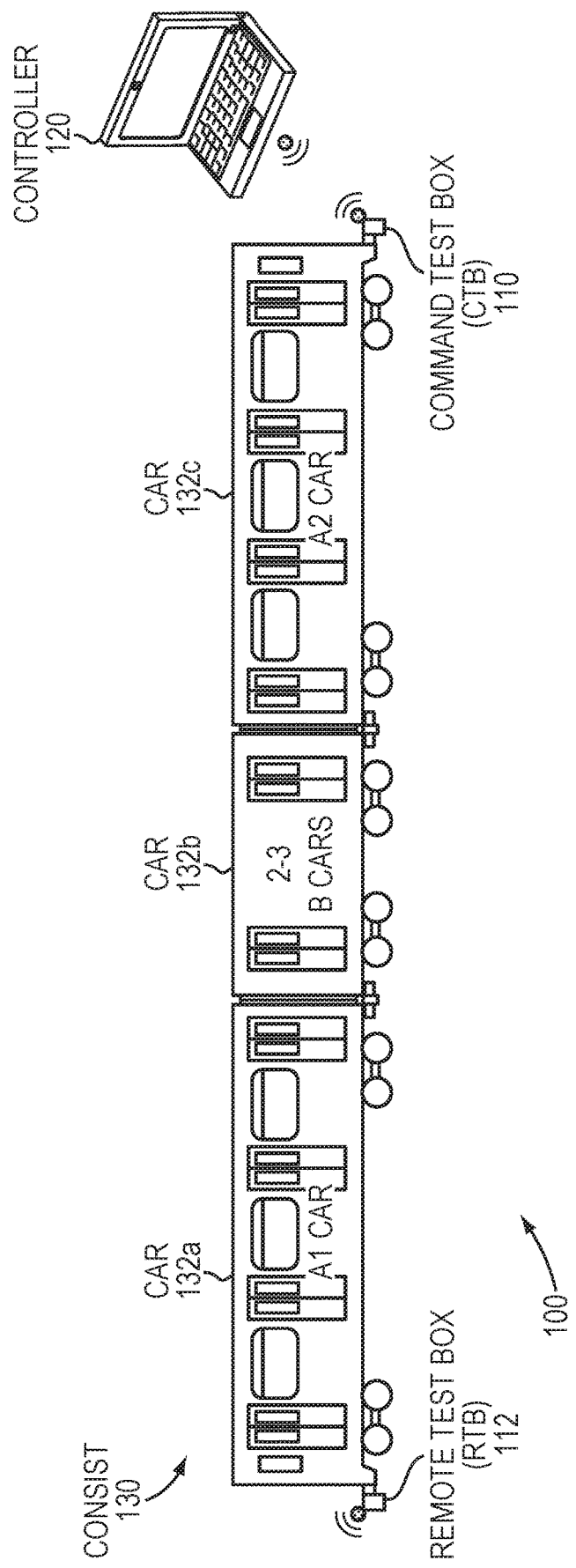
FIGS. 1A-B are diagrams of a system in an example embodiment.
Figure 1B:
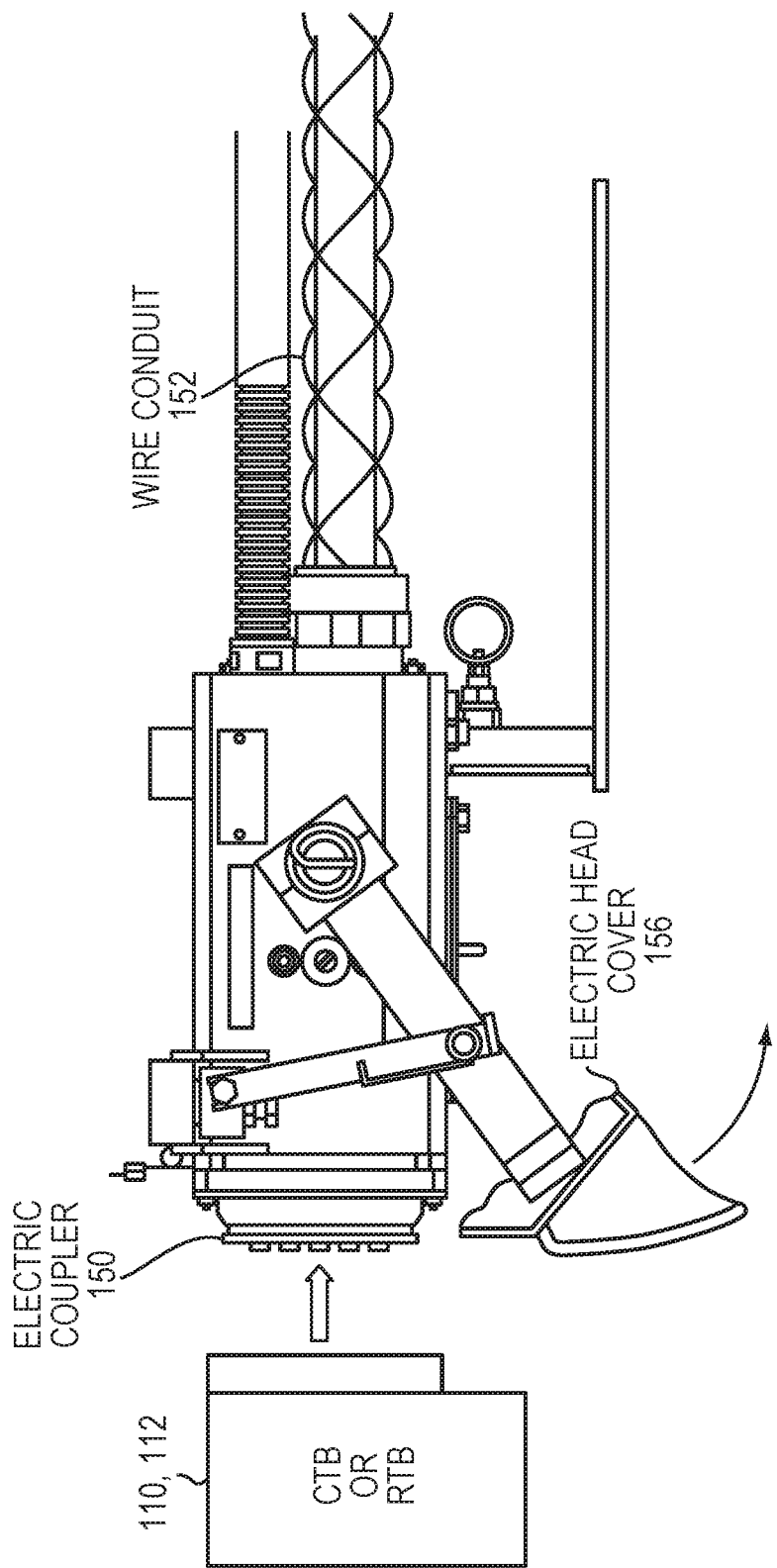

FIGS. 1A-B illustrates a system 100 for testing trainline communications and power infrastructure in an example embodiment. FIG. 1A shows the system 100 as deployed to test trainline communications and power of a consist 130 having a number of rail cars 132a-b. To provide electrical power and communications throughout the train, a plurality of power and communications channels may extend through the entire consist 130. Those channels may be connected between each rail car 132a-c via one or more interfaces that are joined by couplings at the end of each car. FIG. 1B illustrates an example interface in further detail, including an electric coupler 150, electric head cover 156, and a wire conduit 153 encompassing the communications and power lines connected to the electric coupler 150.

To verify the integrity of the power and communications channels, the system 100 provides for testing the channels, as well as diagnosing detected errors within the channels. Referring back to FIG. 1A, the system 100 includes a pair of electrical coupler interfaces referred to as a command test box (CTB) 110 and a remote test box (RTB) 112, as well as a controller 120. The controller 120 may be a laptop, a workstation, or other computing device, such as a smartphone, a tablet, or a cloud-based server. During a test of the communications and power infrastructure of the consist 130, the CTB 110 and RTB 112 may be coupled to a respective electric coupler (e.g., electric coupler 150) at opposite ends of the consist 130, as shown for example in FIG. 1B. Alternatively, if testing a subset of the consist 130 (e.g., one or more cars making up a portion of the consist 130), then the CTB 110 and RTB 112 may be coupled to respective interfaces at opposite ends of the subset. One or both of the CTB 110 and RTB 112 may be configured to wirelessly communicate with the controller 120.

Figure 2:
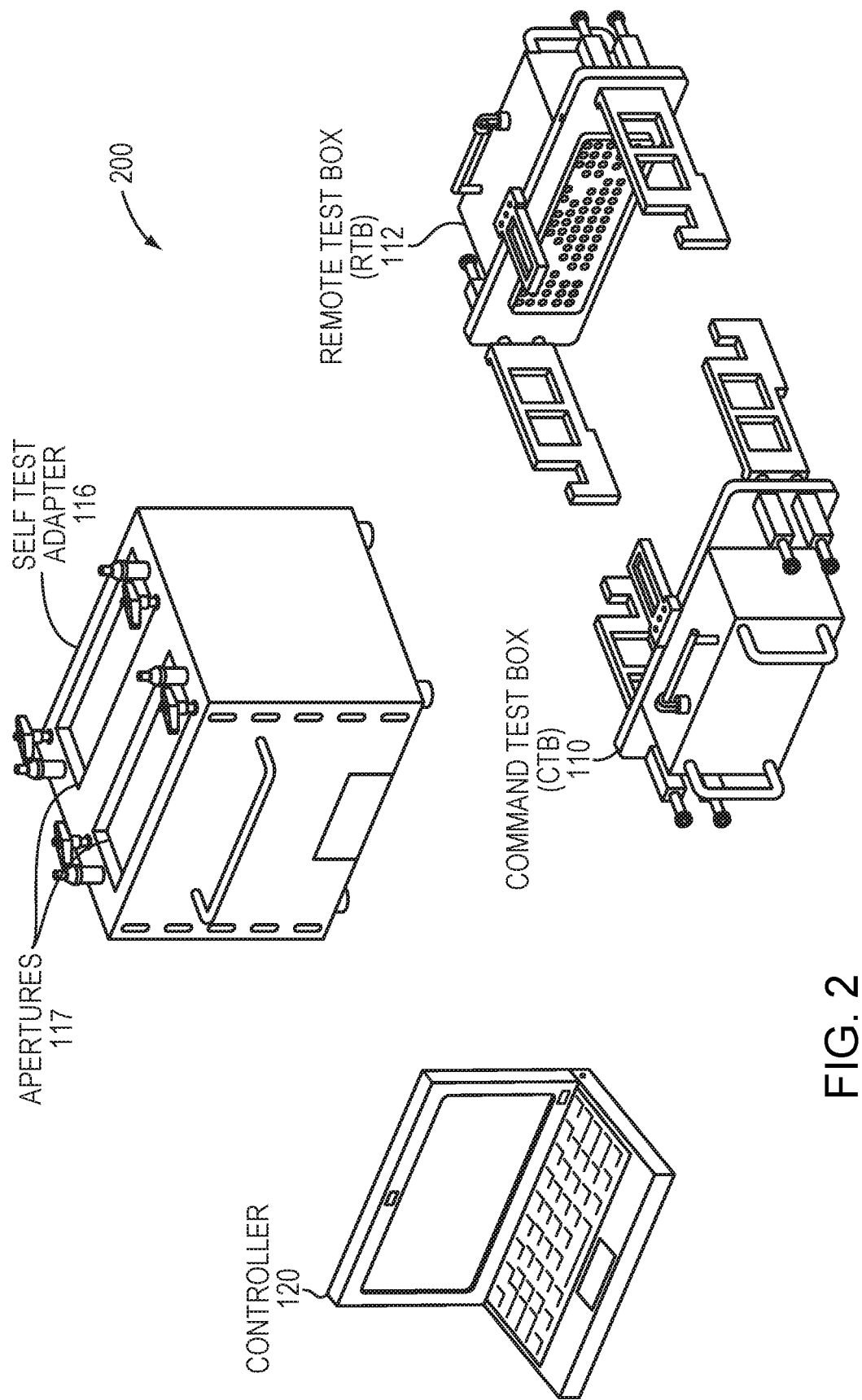
FIG. 2 illustrates components of a system in one embodiment.

FIG. 2 illustrates components of the system 100 in further detail. In addition to the controller 120, CTB 110 and RTB 112 described above, the system may also include a self test adapter 116. The self test adapter 116 can include a pair of apertures 117 into which the CTB 110 and RTB 112 may be inserted. Within the apertures 117, the self test adapter 116 may include a pair of interconnected interfaces to which the CTB 110 and RTB 112 may connect. Operation of the self test adapter is described in further detail below with reference to FIG. 5.

Figure 3A:
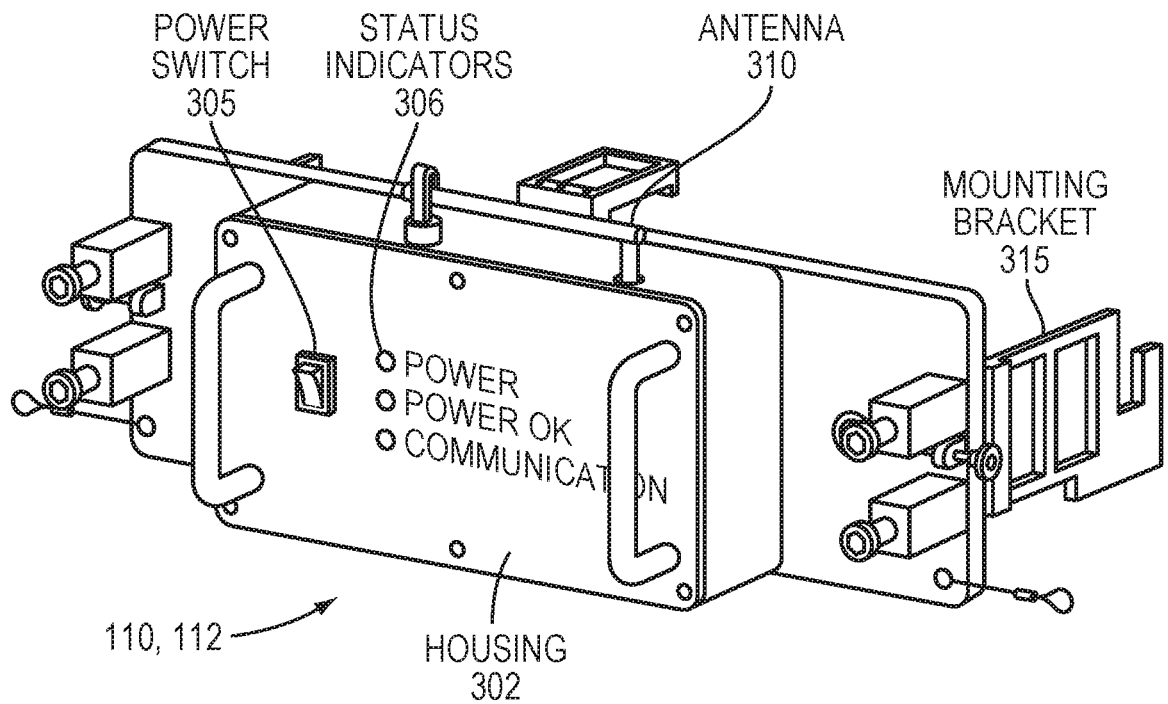
FIGS. 3A-B illustrate a command test box and a remote test box in one embodiment.
Figure 3B:
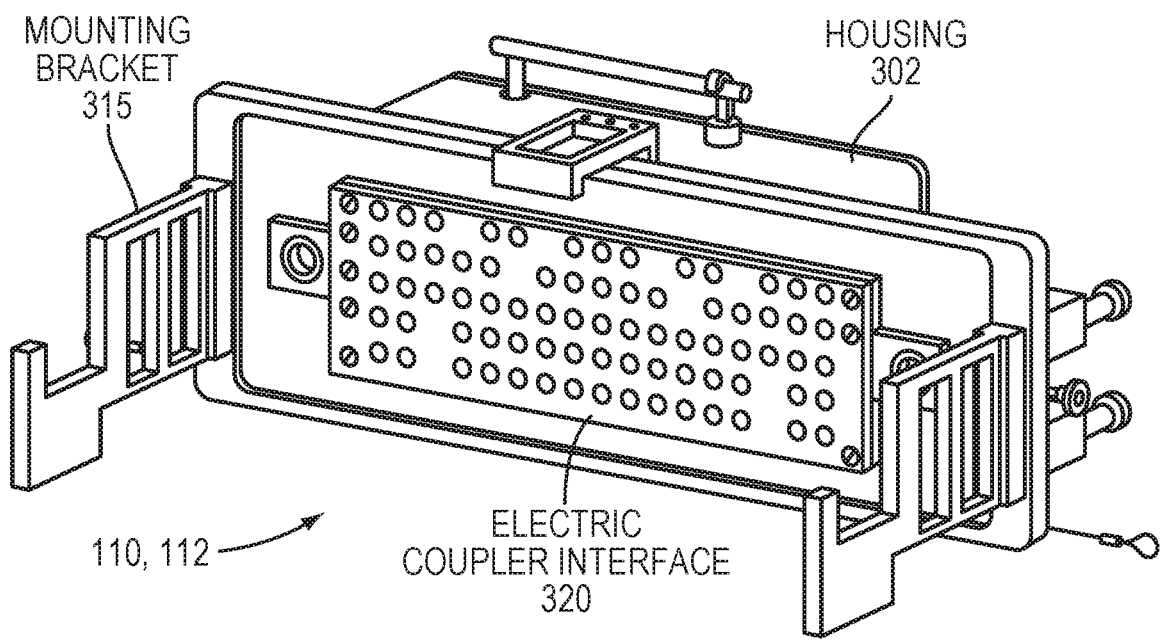

FIGS. 3A-B illustrate a CTB 110 and/or RTB 112. Although the CTB 110 and RTB 112 may be separate devices, each may include some or all of the features depicted in FIGS. 3A-B. In particular, FIG. 3A shows a front view of the CTB/RTB 110, 112, and depicts a housing 302 having a power switch 305 and status indicators (e.g., "POWER," POWER OK" and "COMMUNICATION") at a front panel, as well as an antenna 310 enabling wireless communications extending above a top portion of the housing 302. FIG. 3B shows a rear view of the CTB/RTB 110, 112, and depicts a mounting bracket 315 and electric coupler interface 320. The electric coupler interface 320 may have a pin configuration partially or fully matching the pin configuration of the electric coupler 150 of a rail car (e.g., rail car 132a). For example, the electric coupler interface 320 may include 74 pins in a configuration matching the pin configuration of the electric coupler 150.

The housing 302 may also encompass a circuit board and/or other computing device (e.g., PIC Microcontroller, XBEE Wireless radio module operating at 900 Mhz) (not shown) that is communicatively coupled to the electric coupler interface 320 and antenna 310, and is configured to perform the operations of the CTB 110 and/or RTB 112 described below.

Thus, the CTB 110 and RTB 112 may each include an interface to be coupled to a corresponding communications/power interface of the consist 130, as well as clamping hardware for maintaining a secure coupling of the interface. A microcontroller at the CTB 110 may operate to apply test signals to the respective interface, and a wireless radio can maintain communications with the controller 120 to indicate the test signals applied. Conversely, a microcontroller at the RTB 112 may operate to read the respective interface to detect the test signals, and a wireless radio communicates with the controller 120 to indicate whether the test signal is present at the respective interface. In alternative embodiments, the controller 120 may communicate with the RTB 112 or CTB 110 via a wired channel, or may be integrated into the RTB 112 or CTB 110.

Figure 4:
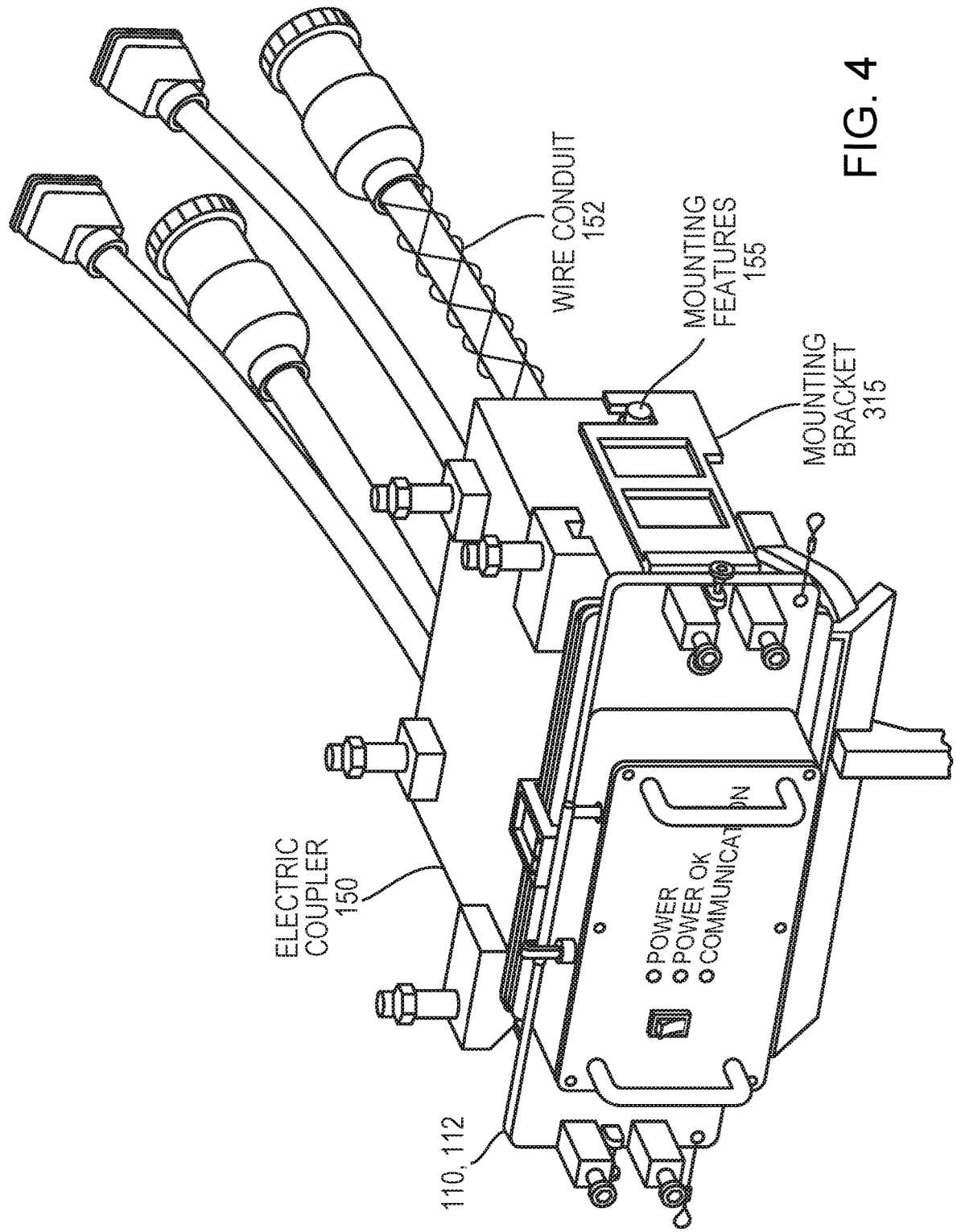
FIG. 4 illustrate a command test box or a remote test box coupled to an electric coupler.

FIG. 4 illustrate a CTB 110 or RTB 112 coupled to the electric coupler 150 of a rail car (e.g., rail car 132a). When coupled, the pins of the electric coupler interface 320 may align with corresponding pins of the electric coupler 150. Further, the mounting bracket 315 of the CTB 110 or RTB 112 may align with mounting features 155 of the electric coupler 150, thereby securing the CTB 110 or RTB 112 to the electric coupler 150 during a testing operation.

Figure 5:
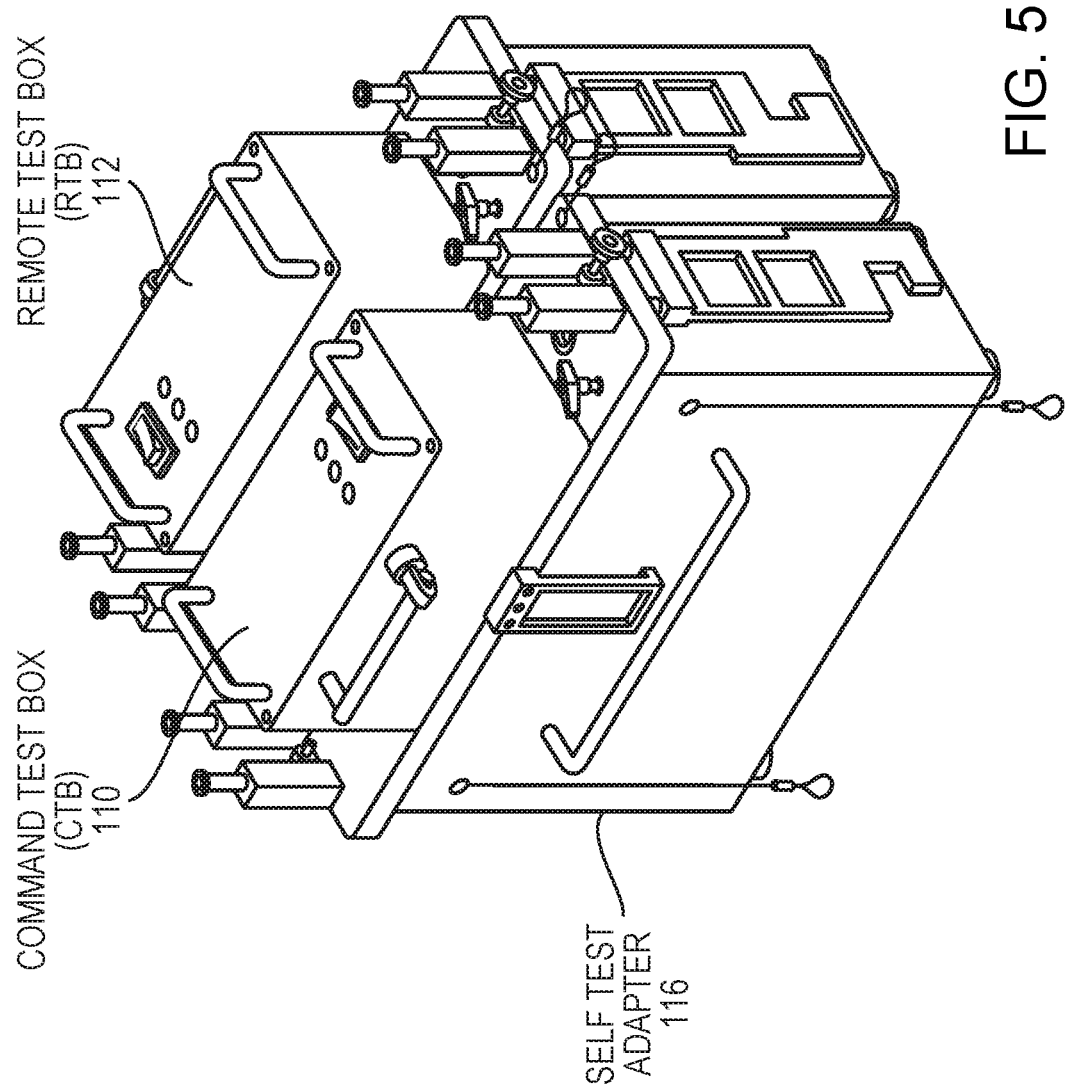
FIG. 5 illustrate a command test box and a remote test box coupled to a self test adapter in one embodiment.

FIG. 5 illustrate the CTB 110 and RTB 112 coupled to the self test adapter 116. The self test adapter 116 may include a pair of interconnected interfaces to which the CTB 110 and RTB 112 may connect, thereby communicatively coupling CTB 110 and RTB 112 for a self test. In this configuration, by running a test comparable to a test of a consist (described below), the integrity of the CTB 110 and RTB 112 can be verified. The CTB 110 and RTB 112 may detect a power input (e.g., AC 120V) into the self test adapter 116 and activate a pre-configured self test function. During the self test function, the CTB 110 and RTB 112 may communicate via some or all of the pins of the respective electric coupler interfaces through the self test adapter 116, thereby determining whether the CTB 110 and RTB 112 are functioning normally or whether either the CTB 110 and RTB 112 is exhibiting a fault. The self test adapter 116 can also be used to store the CTB 110 and RTB 112 when not in use.

With reference to FIGS. 1-5, an example test operation, utilizing the system 100 to test the integrity of trainline communications and power of a consist 130, may be completed as follows. As an optional action to verify the integrity of the CTB 110 and RTB 112, the CTB 110 and RTB 112 may first be connected together with the self test adapter 112 as shown in FIG. 5, and a self test may be run as described above. Once the CTB 110 and RTB 112 are verified to be in working order, they may be implemented to test the consist 130. To do so, a user may walk to one end of the consist and install the RTB 112 on the electric coupler at one end of the consist 130 (e.g., at rail car 132a) as shown in FIG. 1, and turn on the RTB 112, ensuring that the power LED of the RTB 112 is lit. The user may then walk to the opposite end of the consist 130 and install the CTB 110 on an electric coupler at an opposite end of the consist 130 (e.g., at rail car 132c) as shown in FIG. 1, and likewise turn it on, ensuring the power LED of the CTB 110 is lit.

With the CTB 110 and RTB 112 installed at opposite ends of the consist 130 and activated, the user may then engage with the controller 120 to initiate one or more testing and diagnosis programs. The controller 120 may indicate, via a connection indicator, whether the CTB 110 and RTB 112 are in wireless communication with the controller 120. If so, then a test operation may begin. For example, the user may click a "Trainline Test" button at a user interface of the controller 120 to start the test. During the test, the controller 120 may issue commands to the CTB 110 representing various states of the consist 130 (e.g. apply test signals to pins, turn off breakers, etc.). The CTB 110, in response, may initiate those states by applying one or more test signals to its interface 320, and the RTB 112 detects whether those test signals have successfully propagated the consist by reading its respective interface.

The results of the test(s) may be displayed graphically and/or through a text indicator at the controller 120, thereby informing the operator if there are any faults. An example graphical interface is described below with reference to FIGS. 6A-C. Once the test(s) and diagnosis are complete, the user may then exit the application run by the controller 120, remove the CTB 110 and RTB 112 from their respective electric couplers of the consist 130, and place the CTB 110 and RTB 112 into the self test adapter 116 for storage.

Figure 6A:
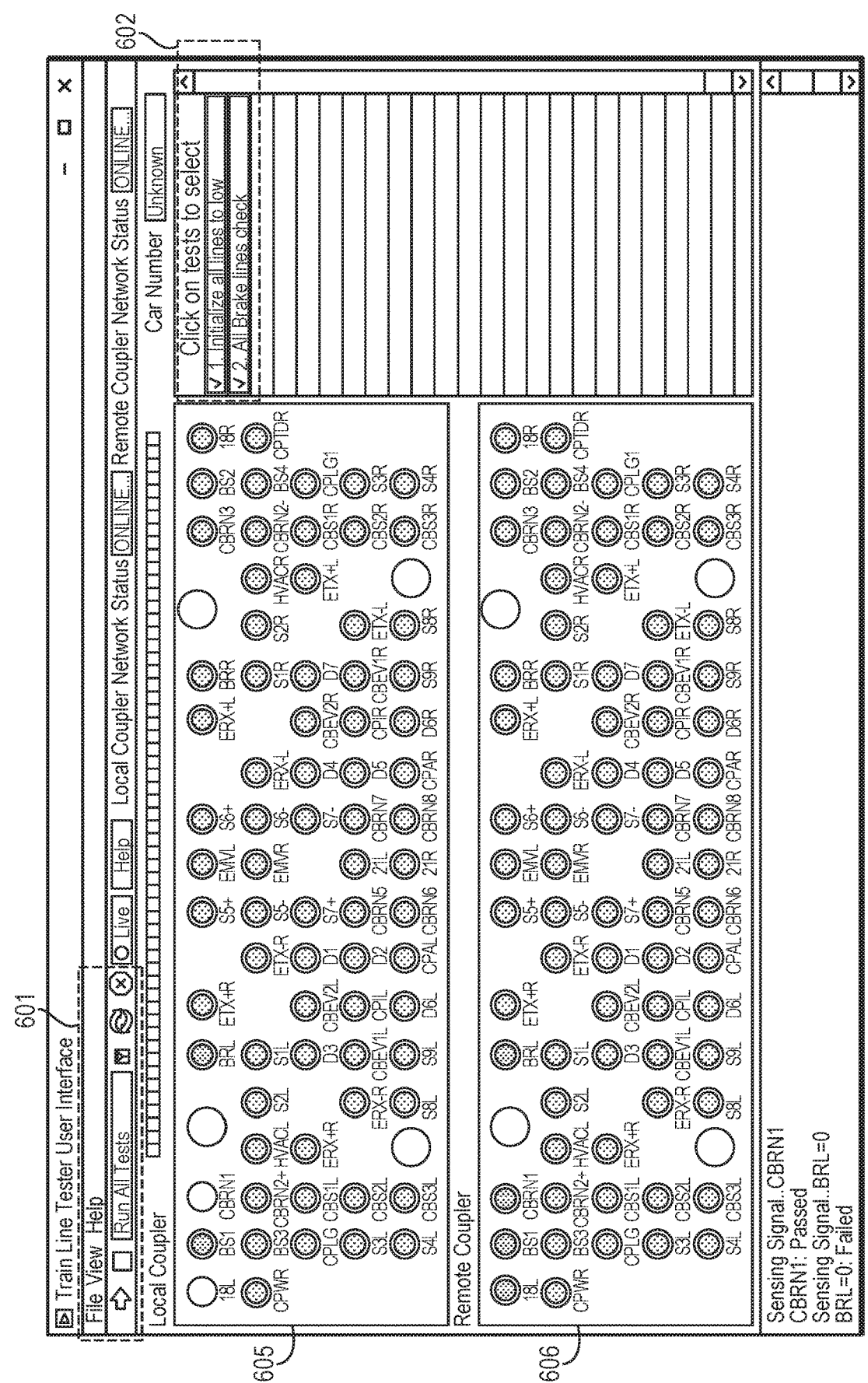
FIGS. 6A-C illustrate a graphical user interface (GUI) of a controller during an example test operation.
Figure 6B:
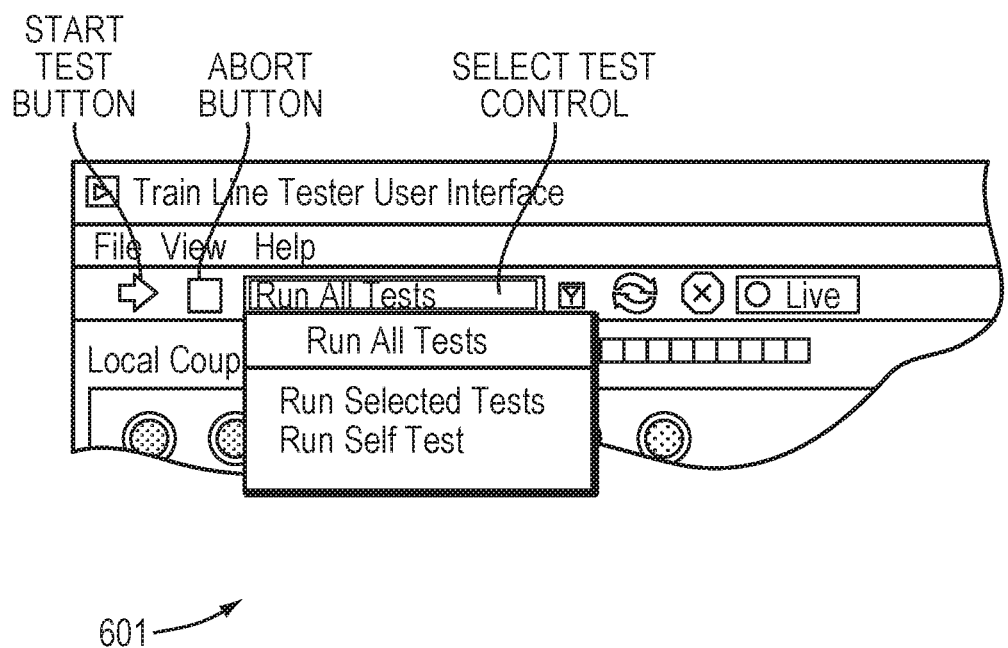
Figure 6C:
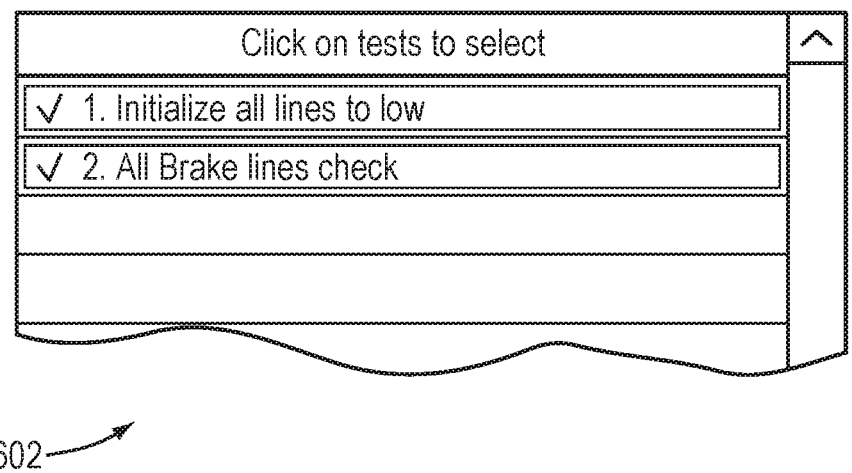

FIGS. 6A-C illustrate a graphical user interface (GUI) 600 of a controller 120 during an example test operation. As shown in FIG. 6A, the GUI 600 may include a test control panel 601 for initiating a test, as well as a test selection panel 602 for selecting one or more tests to be run. The GUI 600 may further include a CTB status panel 605 and a RTB status panel 606. The CTB status panel 605 may display a representation of the individual pins at the CTB 110 interface, while the RTB status panel 606 may display a representation of the individual pins at the RTB 112 interface. At both of the panels 605, 606, a selection of the pins may be marked or highlighted to indicate a range of states or status of those pins (e.g., active, test signal applied, integrity verified, error). For example, the CTB status panel 605 may indicate which of the pins currently exhibit an active signal applied by the CTB 110. Conversely, the RTB status panel 606 may indicate which of the pins at the RTB 112 interface successfully received a signal transmitted by the CTB 110, and may also indicate an error for pins that did not receive a signal expected from the CTB 110.

FIG. 6B illustrates the control panel 601 in further detail. Here, a user may select one or more selected tests (including a self test if the CTB 110 and RTB 112 are connected to the self test adapter 116), initiate that test, and pause or cancel the test. FIG. 6C illustrates the test selection panel 602 in further detail. Here, a test queue may list a succession of tests, and the user may select one or more of the tests to be run. The controller 120 may then run those tests in succession and/or concurrently.

Figure 7:
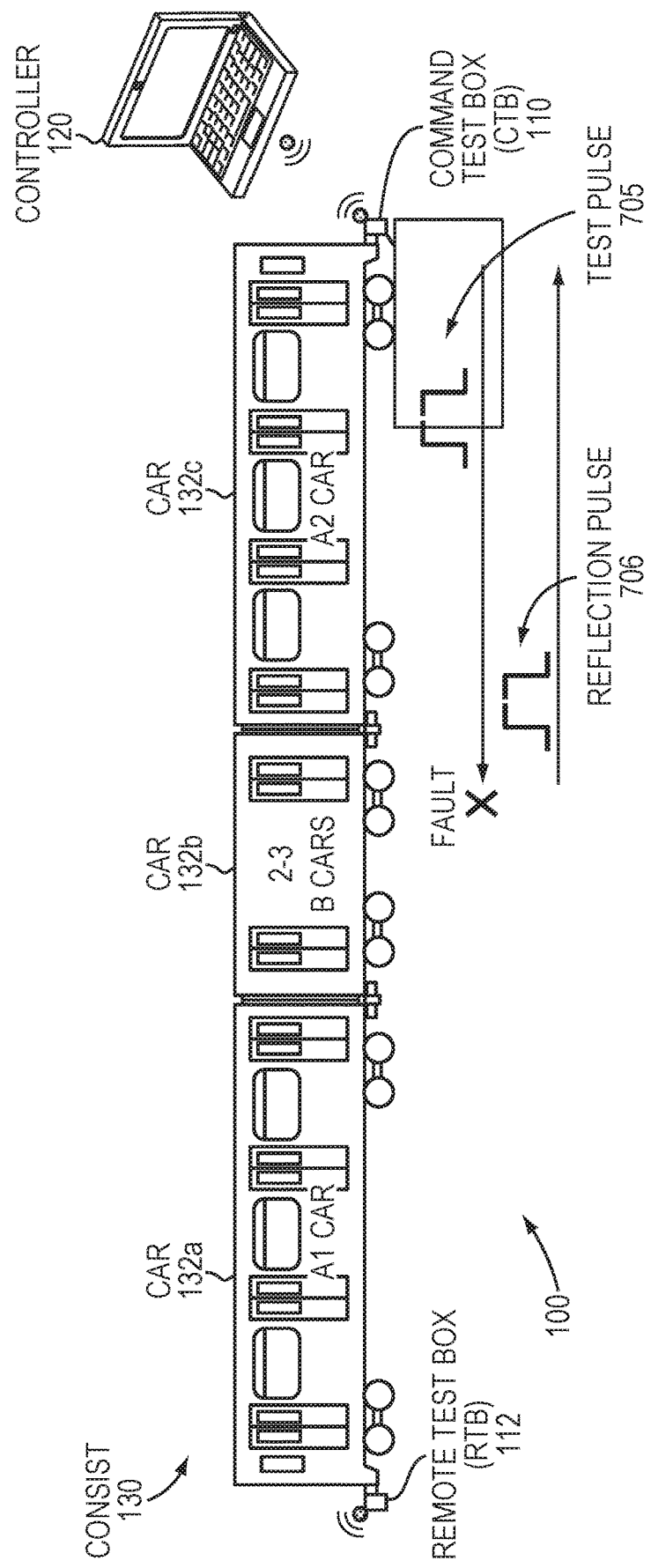
FIG. 7 illustrates a solution for determining the location of a fault in an example embodiment.

FIG. 7 illustrates the system 100 configured, in a further embodiment, to test the integrity of trainline communications and power of the consist 130. The system 100 may be configured and operate as described above, but may include further features for determining the location of a fault in the consist. During a test as described above, the CTB 110 may transmit a test signal as a pulse 705 (e.g., a single or recurring pulse, such as a square wave) toward the RTB 112. If the wire carrying the pulse exhibits a fault (e.g., a break in the wire), then the pulse may be reflected, as a reflection pulse 706, back towards the CTB 110. Using time domain reflectometry, the location of the fault within the consist 130 can be approximated. For example, the controller 120 may measure the time that elapsed between when the CTB 110 transmits the pulse and when the reflection of the pulse is received back at the CTB 110. Based on this measured time value and the known length of the consists 130 and/or the rail cars 132a-c, an approximate location of the fault can be determined. For example, if a fault occurs at the rail car 132b as shown in FIG. 7, the controller 120 may calculate an approximate distance from the CTB 110 at which the fault occurs based on the time difference between the test pulse 705 transmission and the reflection pulse 706 reception at the CTB 110. By aligning this approximate distance with the known length of the consist 130 and/or rail cars 132a-c, the controller 120 can determine that the fault occurred at the car 132b.

While example embodiments have been particularly shown and described, it will be understood by those skilled in the art that various changes in form and details may be made therein without departing from the scope of the embodiments encompassed by the appended claims.

What is claimed is:

1. A system for testing trainline communications, comprising:
    a command test box configured to couple to a first electric coupler at a first end of a consist including at least one car of a railroad train, the command test box being configured to 1) apply a test signal to the first electric coupler and 2) transmit wirelessly an indication of the test signal;
    a remote test box configured to couple to a second electric coupler at a second end of the consist, the remote test box being configured to 1) determine a receive status indicating whether the test signal or signal representative thereof is present at the second electric coupler and 2) transmit wirelessly an indication of the receive status; and
    a controller configured to 1) receive wirelessly the indication of the test signal and the indication of the receive status, 2) compare the indication of the test signal against the receive status, and 3) determine, based on the comparison, whether the test signal has traversed the consist.

2. The system of claim 1, wherein the controller includes a user interface, the controller being configured to display, at the user interface, a diagnosis of the consist based on the comparison.

3. The system of claim 2, wherein the diagnosis includes 1) a representation of at least one of the first and second electric couplers and 2) an indication of whether the test signal has traversed at least one pin of the at least one of the first and second electric couplers.

4. The system of claim 1, wherein the command test box is configured to apply the test signal to a plurality of pins of the first electric coupler.

5. The system of claim 4, wherein the controller is further configured to determine, based on the comparison, whether the test signal has traversed the consist via channels corresponding to the plurality of pins.

6. The system of claim 1, further comprising a self test box, the self test box including a pair of interconnected interfaces configured to couple with the command test box and the remote test box and to emulate electrical characteristics between corresponding interfaces of a consist.

7. The system of claim 1, wherein the controller is further configured to determine a location of a fault based on a time at which a reflection of the test signal is received at the command test box.

8. A system for testing trainline communications, comprising:
    a command test box configured to couple to a first electric coupler at a first end of a consist including at least one car of a railroad train, the command test box being configured to 1) apply a test signal to the first electric coupler and 2) transmit an indication of the test signal;
    a remote test box configured to couple to a second electric coupler at a second end of the consist, the remote test box being configured to 1) determine a receive status indicating whether the test signal or signal representative thereof is present at the second electric coupler and 2) transmit an indication of the receive status; and
    a controller configured to 1) receive the indication of the test signal and the indication of the receive status, 2) compare the indication of the test signal against the receive status, and 3) determine, based on the comparison, whether the test signal has traversed the consist.

9. The system of claim 8, wherein the command test box is further configured to transmit wirelessly to the controller the indication of the test signal.

10. The system of claim 9, wherein the controller and the remote test box are enclosed within a common enclosure.

11. The system of claim 8, wherein the remote test box is further configured to transmit wirelessly the indication of the receive status.

12. The system of claim 11, wherein the controller and the command test box are enclosed within a common enclosure.

13. The system of claim 8, wherein the remote test box is further configured to transmit the indication of the receive status via a channel connected to the first and second electric couplers.

14. The system of claim 13, wherein the controller and the command test box are enclosed within a common enclosure, and wherein the controller is further configured to receive the indication of the receive status at the first electric coupler.

15. The system of claim 8, wherein the controller is further configured to determine a location of a fault based on a time at which a reflection of the test signal is received at the command test box.

\* \* \* \* \*